(12) United States Patent
Park et al.

(10) Patent No.: US 12,354,648 B2
(45) Date of Patent: Jul. 8, 2025

(54) BIT LINE SENSE AMPLIFIER AND BIT LINE SENSING METHOD OF SEMICONDUCTOR MEMORY DEVICE

(71) Applicant: SAMSUNG ELECTRONICS CO., LTD., Suwon-si (KR)

(72) Inventors: Chaehwan Park, Suwon-si (KR); Keewon Kwon, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 257 days.

(21) Appl. No.: 18/167,436

(22) Filed: Feb. 10, 2023

(65) Prior Publication Data

US 2023/0260567 A1    Aug. 17, 2023

(30) Foreign Application Priority Data

Feb. 11, 2022  (KR) .................. 10-2022-0018468
Jun. 2, 2022   (KR) .................. 10-2022-0067700

(51) Int. Cl.
　　G11C 11/4091    (2006.01)
　　G11C 11/4094    (2006.01)
　　G11C 11/4097    (2006.01)

(52) U.S. Cl.
　　CPC ............................. *G11C 11/4091* (2013.01)

(58) Field of Classification Search
　　CPC ........... G11C 11/4091; G11C 11/4097; G11C 11/4094
　　See application file for complete search history.

(56) References Cited

U.S. PATENT DOCUMENTS

| | | | |
|---|---|---|---|
| 6,438,051 B1* | 8/2002 | Fifield | G11C 7/067 365/207 |
| 6,566,913 B2 | 5/2003 | Dai | |
| 7,915,927 B2 | 3/2011 | Lee | |
| 9,202,531 B2 | 12/2015 | Seo | |
| 9,406,354 B1 | 8/2016 | Jung et al. | |
| 9,773,544 B2 | 9/2017 | Woo et al. | |
| 10,224,093 B2 | 3/2019 | Kim et al. | |
| 10,950,279 B2 | 3/2021 | Jeong et al. | |
| 2016/0078914 A1* | 3/2016 | DeBrosse | G11C 11/1673 365/158 |

* cited by examiner

*Primary Examiner* — Son T Dinh
*Assistant Examiner* — Elizabeth Rose Agger
(74) *Attorney, Agent, or Firm* — Myers Bigel, P.A.

(57) ABSTRACT

A bit line sense amplifier includes: a first inverter configured to receive an input signal from a bit line via an input terminal and output a first signal to a first node; a second inverter configured to receive the first signal and output a second signal to a second node; a differential amplifier configured to receive the input signal as a positive input, and receive the second signal as a negative input; and a first switch configured to electrically connect the input terminal to the positive input of the differential amplifier and a second switch configured to electrically connect the second node to the negative input of the differential amplifier.

20 Claims, 17 Drawing Sheets

BIT LINE SENSE AMPLIFIER AND BIT LINE SENSING METHOD OF SEMICONDUCTOR MEMORY DEVICE

CROSS-REFERENCE TO RELATED APPLICATIONS

This application is based on and claims priority under 35 U.S.C. § 119 to Korean Patent Application Nos. 10-2022-0018468, filed on Feb. 11, 2022 and 10-2022-0067700, filed on Jun. 2, 2022 in the Korean Intellectual Property Office, the disclosures of which are incorporated by reference herein in their entireties.

BACKGROUND

The inventive concept relates to bit line sense amplifiers and bit line sensing methods of semiconductor memory devices, and more particularly, to bit line sensing methods using a bit line sense amplifier implemented as a single ended sense amplifier.

Semiconductor memory devices tend to require high-capacity and low-power, high-speed operations according to needs of users. As the capacity of the semiconductor memory devices increases, loading mismatch phenomenon between a bit line and a complementary bit line connected to a bit line sense amplifier according to a fine process, or threshold voltage mismatch phenomenon between transistors in the bit line sense amplifier occurs. Those phenomena may decrease sensing efficiency, such as a sensing margin and a sensing speed, of a bit line sense amplifier.

SUMMARY

According to disclosed embodiments, a bit line sense amplifier configured as a single ended sense amplifier type is provided.

In addition, the disclosed bit line sense amplifier converts an input signal and continuously provides feedback for the converted input signal to provide a bit line sensing method for reducing capacitance load for an offset compensation object signal.

According to an aspect of the inventive concept, a bit line sense amplifier includes: a first inverter configured to receive an input signal from a bit line via an input terminal and output a first signal to a first node; a second inverter configured to receive the first signal and output a second signal to a second node; a differential amplifier configured to receive the input signal as a positive input, and receive the second signal as a negative input; and a first switch configured to connect the input terminal to the positive input of the differential amplifier and a second switch configured to connect the second node to the negative input of the differential amplifier, wherein the first inverter is connected to the second inverter through a first current source configured to adjust the first signal by providing a pull-up current to the first inverter and a second current source configured to adjust the first signal by providing a pull-down current to the second inverter.

According to another aspect of the inventive concept, a bit line sensing method performed by a bit line sense amplifier includes: inputting an input signal via an input terminal; outputting a first signal to a first node when the input signal is input to a first inverter; outputting a second signal to a second node by a second inverter after the first signal is input to the second inverter; inputting the input signal as a positive input and inputting the second signal as a negative input to a differential amplifier; when a first switch is closed, inputting the input signal to the differential amplifier; and when a second switch is closed, inputting the second signal to the differential amplifier, wherein the first signal is adjusted by a first current source providing a pull-up current and a second current source providing a pull-down current.

According to another aspect of the inventive concept, a bit line sense amplifier configured to perform a bit line sensing operation includes: a first inverter configured to receive an input signal via an input terminal and output a first signal; a second inverter configured to receive the first signal and output a second signal to a second node; a differential amplifier configured to receive the input signal as a positive input, and receive the second signal as a negative input; a first switch configured to connect the input terminal to the positive input of the differential amplifier; a second switch configured to connect the second node to the negative input of the differential amplifier; a first current source configured to adjust the first signal by providing a pull-up current; a second current source configured to adjust the first signal by providing a pull-down current; and a switching unit configured to connect the input terminal to a plurality of bit lines.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Terms used in the inventive concept are briefly described, and embodiments are described in detail.

Figure 1:
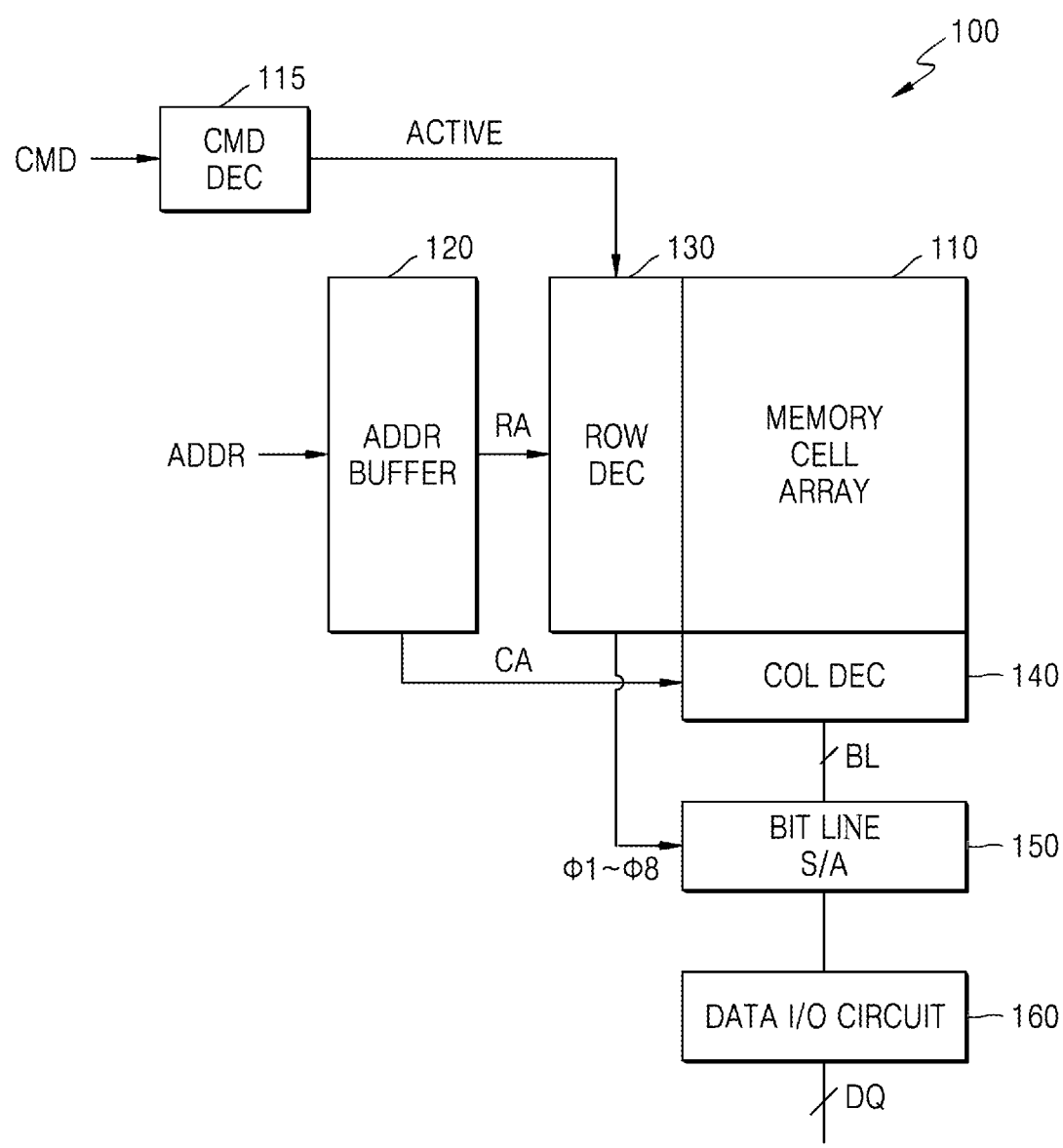
FIG. 1 is a diagram of a memory device according to an embodiment.

FIG. 1 is a diagram of a memory device 100 according to an embodiment.

Referring to FIG. 1, the memory device 100 may include a storage device based on a semiconductor device. For example, the memory device 100 may include dynamic random-access memory (RAM) (DRAM), such as synchronous DRAM (SDRAM), double data rate (DDR) SDRAM (DDR SDRAM), low power double data rate SDRAM (PLDDR SDRAM), graphics DDR (GDDR), DDR3 SDRAM, and DDR4 SDRAM, or resistive memory, such as phase change RAM (PCRAM), magnetic RAM (MRAM), and resistive RAM (RRAM).

The memory device 100 may output data via data lines DQ in response to a command CMD, an address ADDR, and control signals, which are received from an external device, for example, a memory controller. The memory device 100 may include a memory cell array 110, a command decoder 115, an address buffer 120, a row decoder 130, a column decoder 140, a bit line sense amplifier 150, and a data input/output circuit 160.

The memory cell array 110 may include a plurality of memory cells provided in a matrix form arranged in rows and columns. The memory cell array 110 may include a plurality of word lines and a plurality of bit lines BL respectively connected to the memory cells. The plurality of word lines may be respectively connected to rows of the memory cells, and the plurality of bit lines BL may be respectively connected to columns of the memory cells.

The command decoder 115 may generate control signals corresponding to the command CMD, by decoding a write enable signal /WE, a row address strobe signal /RAS, a column address strobe signal /CAS, a chip select signal /CS, or the like, which are received from an external device, for example, the memory controller. The command CMD may include an active command, a read command, a write command, a precharge command, and the like. The command decoder 115 may generate an active signal ACTIVE based on an active command.

The address buffer 120 may receive the address ADDR from an external device, for example, a memory controller. The address ADDR may include a row address RA for addressing a row of the memory cell array 110 and a column address CA for addressing a column of the memory cell array 110. The address buffer 120 may transmit the row address RA to the row decoder 130, and the column address CA to the column decoder 140.

The row decoder 130 may select any one of a plurality of word lines connected to the memory cell array 110. The row decoder 130 may decode the row address RA received from the address buffer 120, select any one word line corresponding to the row address RA, and activate the selected word line.

The column decoder 140 may select a certain bit line BL among the plurality of bit lines BL of the memory cell array 110. The column decoder 140 may decode the column address CA received from the address buffer 120, and select a certain bit line BL corresponding to the column address CA, and activate the selected bit line BL.

The bit line sense amplifier 150 may be connected to the bit lines BL of the memory cell array 110. The bit line sense amplifier 150 may sense a voltage change of the selected bit line BL of the plurality of bit lines BL, and amplify and output the sensed voltage change. The data input/output circuit 160 may output, to the outside via data lines DQ, data output based on the voltage change, which is sensed and amplified by the bit line sense amplifier 150.

The bit line sense amplifier 150 may receive switching signals $\Phi 1$-$\Phi 8$ from the row decoder 130. The switching signals $\Phi 1$-$\Phi 8$ may be provided by the row decoder 130 corresponding to the active signal ACTIVE received from the command decoder 115, and may be selectively activated when a word line driving voltage is applied to a word line corresponding to the row address RA.

The switching signals $\Phi 1$-$\Phi 8$ may control a plurality of switches included in the bit line sense amplifier 150. As the switches are turned on or off by the switching signals $\Phi 1$-$\Phi 8$, the bit line sense amplifier 150 may perform a precharge operation, an offset removal operation, a charge sharing operation, and a sensing and re-storing operation. The bit line sense amplifier 150 operated based on a switching operation of the switches by the switching signals $\Phi 1$-$\Phi 8$ may be, for convenience of description, referred to as a switchable bit line sense amplifier S/A.

Hereinafter, configurations and operations of the bit line sense amplifier 150 are described in detail with reference to various embodiments.

Figure 2:
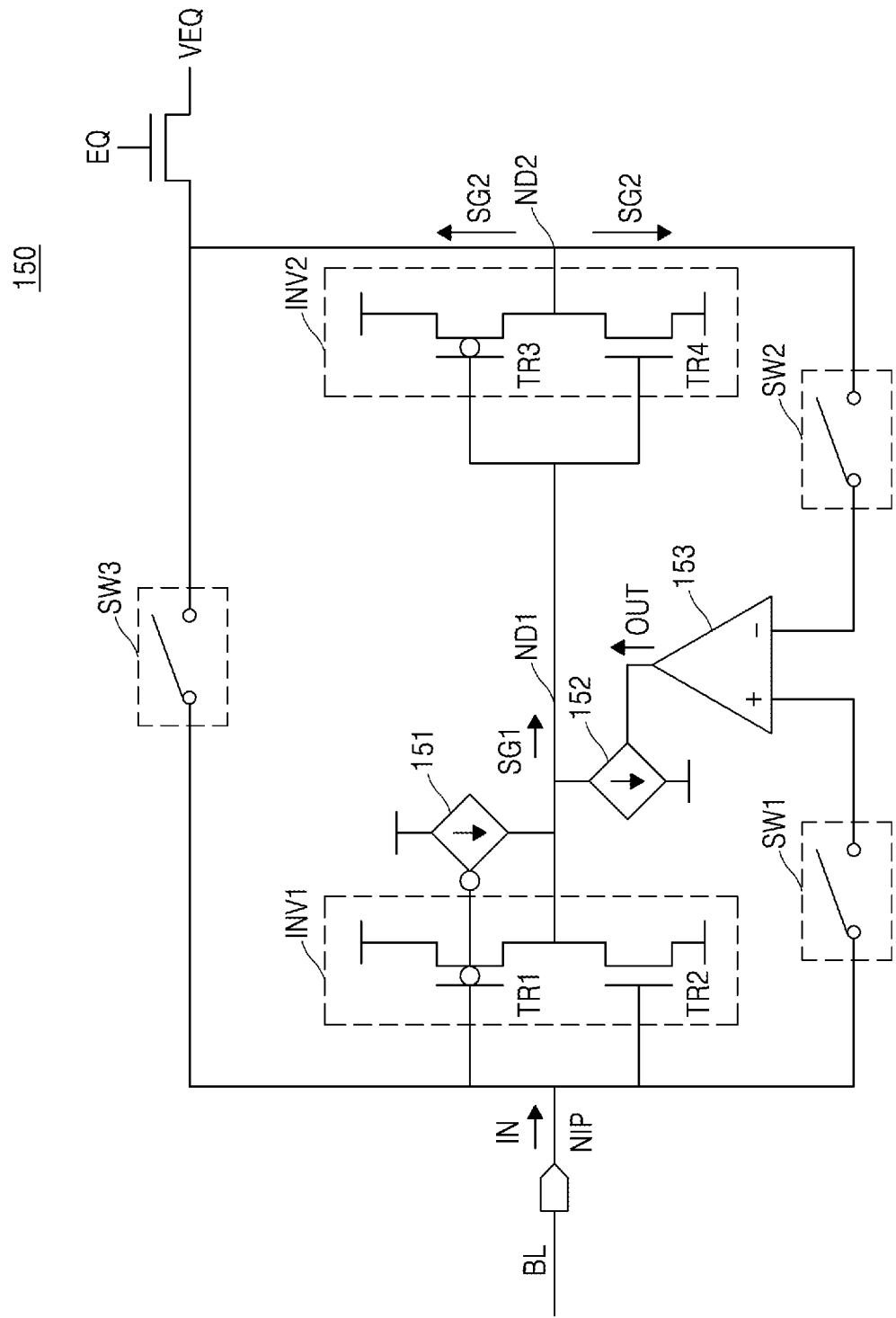
FIG. 2 is a circuit diagram of a bit line sense amplifier according to an embodiment.

FIG. 2 is a circuit diagram of a bit line sense amplifier 150 according to an embodiment.

Referring to FIG. 2, the bit line sense amplifier 150 according to an embodiment may include a first inverter INV1, a second inverter INV2, a first current source 151, a second current source 152, and a differential amplifier 153. In addition, the bit line sense amplifier 150 according to an embodiment may further include a first switch SW1, a second switch SW2, and a third switch SW3.

The first inverter INV1 may receive an input signal IN from the bit line BL, convert the input signal IN, and output a first signal SG1. In this case, the input signal IN may include a signal input from the bit line BL outside the bit line sense amplifier 150, and may include a signal having a large capacitance load. The first inverter INV1 may include a first transistor TR1 and a second transistor TR2.

The second inverter INV2 may receive the first signal SG1 from the first node ND1, convert the first signal SG1, and output a second signal SG2. The second inverter INV2 may include a third transistor TR3 and a fourth transistor TR4, and may perform an offset control operation of the differential amplifier 153 by outputting the second signal SG2. The second signal SG2 and the offset control operation are described in detail with reference to FIG. 3.

The first current source 151 may adjust the intensity of the first signal SG1 by adjusting current input by the first inverter INV1. For example, the first current source 151 may include a pull-up current source, and the first current source 151 may adjust the first signal SG1 by adjusting the output of the first inverter INV1, and as a result of adjusting the first signal SG1, the second signal SG2 may be adjusted and the bit line sense amplifier 150 may perform the offset compensation operation on the first signal SG1.

Similar to the first current source 151, the second current source 152 may adjust the first signal SG1. For example, the second current source 152 may include a pull-down current source, and the second current source 152 may adjust the intensity of the first signal SG1, and as a result of adjusting the intensity of the first signal SG1, the second signal SG2 may be adjusted and the bit line sense amplifier 150 may perform an offset compensation operation on the first signal SG1.

The differential amplifier 153 may output an output signal OUT by using the input signal IN and the second signal SG2 as inputs. In this case, the output signal OUT may be used as a signal for controlling an operation of the second current source 152. For example, the output signal OUT may be used as a voltage control signal of the second current source 152, and when a pull-down current control operation of the second current source 152 is controlled, the first signal SG 1 may be controlled. As a result, the first signal SG1 may be controlled according to feedback of the second signal SG2, and offset compensation of the first signal SG1 may be possible according to the feedback of the second signal SG2.

The bit line sense amplifier 150 according to the inventive concept may include the first switch SW1, the second switch SW2, and the third switch SW3. In addition, the bit line sense amplifier 150 according to the inventive concept may receive a precharge control signal VEQ for performing a precharge operation and a restoration operation. The first switch SW1 and the second switch SW2 may be closed when an offset compensation operation is performed, and the third switch SW3 may be closed when the bit line sense amplifier 150 performs a restoration operation. In addition, when all of the first switch SW1, the second switch SW2, and the third switch SW3 are open, a bit line sensing operation may be performed. Descriptions of the offset compensation operation, the bit line sensing operation, and the restoration operation of the bit line sense amplifier 150 according to disclosed embodiments are given in detail with reference to FIGS. 3 through 5.

Figure 3:
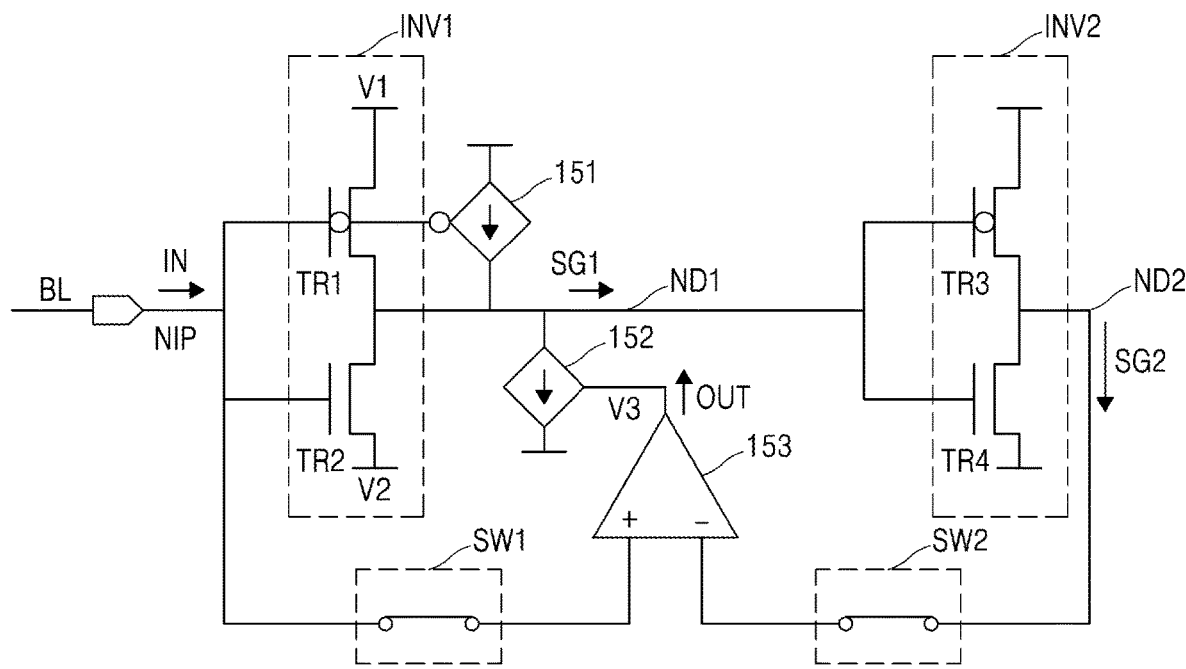
FIG. 3 is a circuit diagram illustrating a case where a bit line sense amplifier performs an offset compensation operation, according to an embodiment.

FIG. 3 is a circuit diagram illustrating a case where the bit line sense amplifier 150 performs the offset compensation operation, according to an embodiment.

Referring to FIG. 3, when the first switch SW1 and the second switch SW2 of the bit line sense amplifier 150 according to an embodiment are closed, the offset compensation operation of the differential amplifier 153 may be performed. In this case, when the bit line sense amplifier 150 performs the offset compensation operation, the input signal IN and the second signal SG2 may be used as inputs of the differential amplifier 153.

For example, the first switch SW1 and the second switch SW2 may be closed, and the input signal IN may be input to the differential amplifier 153 as a positive input. In addition, the second signal SG2 may be input to the differential amplifier 153 as a negative input. The differential amplifier 153 may receive the input signal IN and the second signal SG2 of the bit line BL and generate the output signal OUT. In this case, the output signal OUT may be used as a voltage control signal of the second current source 152. When the output signal OUT is input to the second current source 152, the second current source 152 may generate a pull-down current for adjusting the first signal SG1 for the offset compensation operation of the differential amplifier 153. When the pull-down current is generated, a value of the first signal SG1 may be adjusted, and the adjusted first signal SG1 may be input to the second inverter INV2 again. In this case, when a magnitude of the first signal SG1 is less than a value required for the offset compensation, the first current source 151 may adjust the first signal SG1 by generating a pull-up current. In other words, the bit line sense amplifier 150 according to an embodiment may continuously provide the first signal SG1 as feedback, generate a new second signal SG2, and ultimately perform the offset compensation operation of the first signal SG1.

Figure 4:
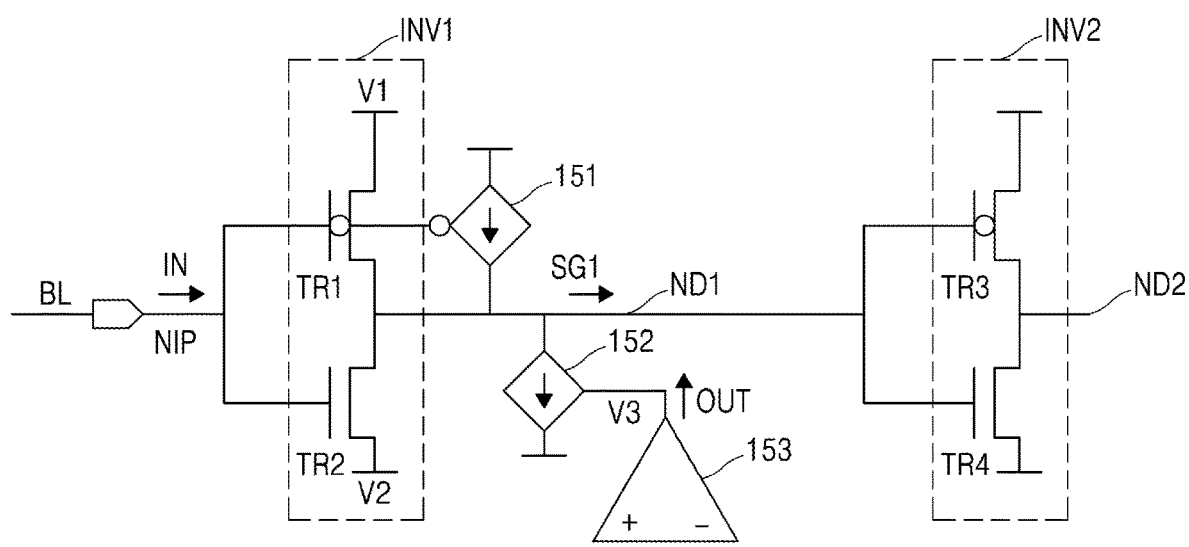
FIG. 4 is a circuit diagram illustrating a case where a bit line sense amplifier performs a sensing operation, according to an embodiment.

FIG. 4 is a circuit diagram illustrating a case where the bit line sense amplifier 150 performs the sensing operation, according to an embodiment.

Referring to FIG. 4, according to an embodiment, when data of the bit line BL is sensed, the first switch SW1, the second switch SW2, and the third switch SW3 may be open. For example, when magnitudes of the second signals SG2 output to the input signal IN and the second node ND2 are equal, and the first switch SW1, the second switch SW2, and the third switch SW3 are open, at the first node ND1, the offset compensation operation on the first signal SG1 may not be performed, and the bit line sense amplifier 150 may perform a charge sharing operation and the sensing operation on the bit line BL. In this case, the first current source 151 and the second current source 152 may not generate a pull-up or a pull-down current.

Figure 5:
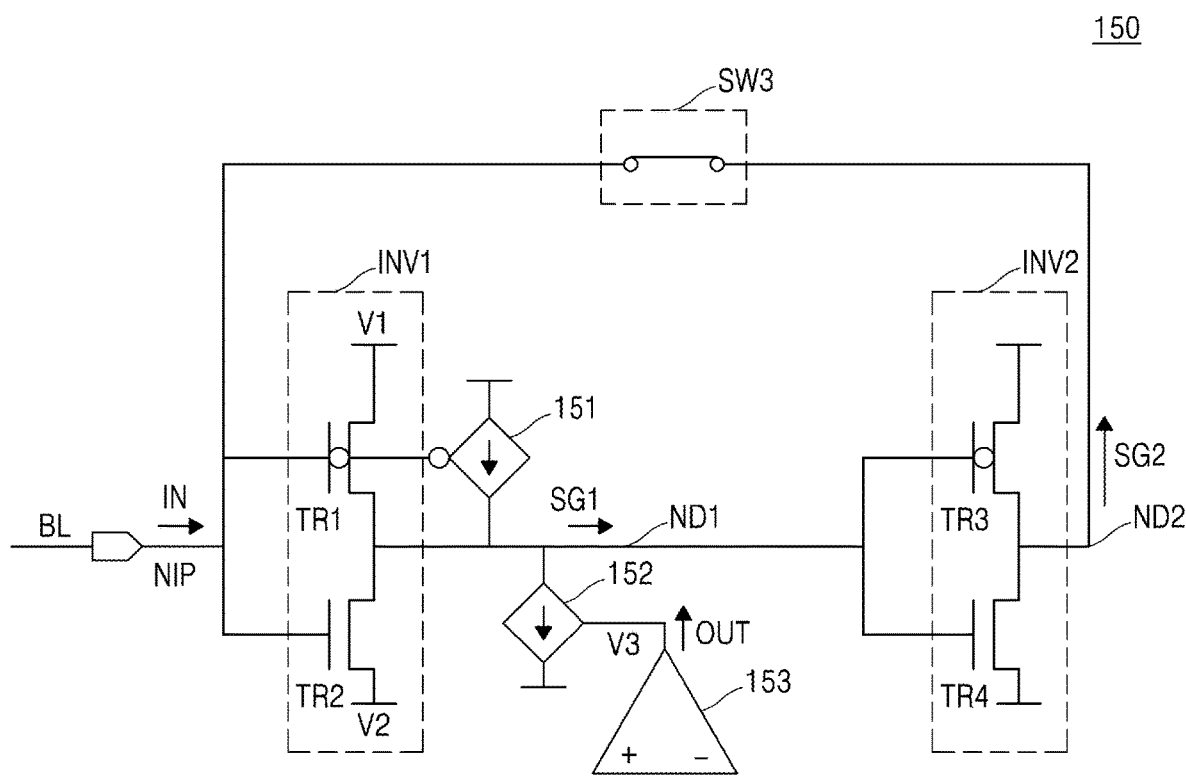
FIG. 5 is a circuit diagram illustrating a case where a bit line sense amplifier performs a restoration operation, according to an embodiment.

FIG. 5 is a circuit diagram illustrating a case where the bit line sense amplifier 150 performs the restoration operation, according to an embodiment.

Referring to FIG. 5, when the third switch SW3 is closed, the restoration operation of the bit line sense amplifier 150 according to an embodiment may be performed. When the third switch SW3 is closed and the first switch SW1 and the second switch SW2 are open, an input terminal NIP of the bit line sense amplifier 150 may be connected to a second node ND2 thereof. When the input terminal NIP of the bit line sense amplifier 150 is connected to the second node ND2 thereof, data may be restored in the memory cell.

Figure 6:
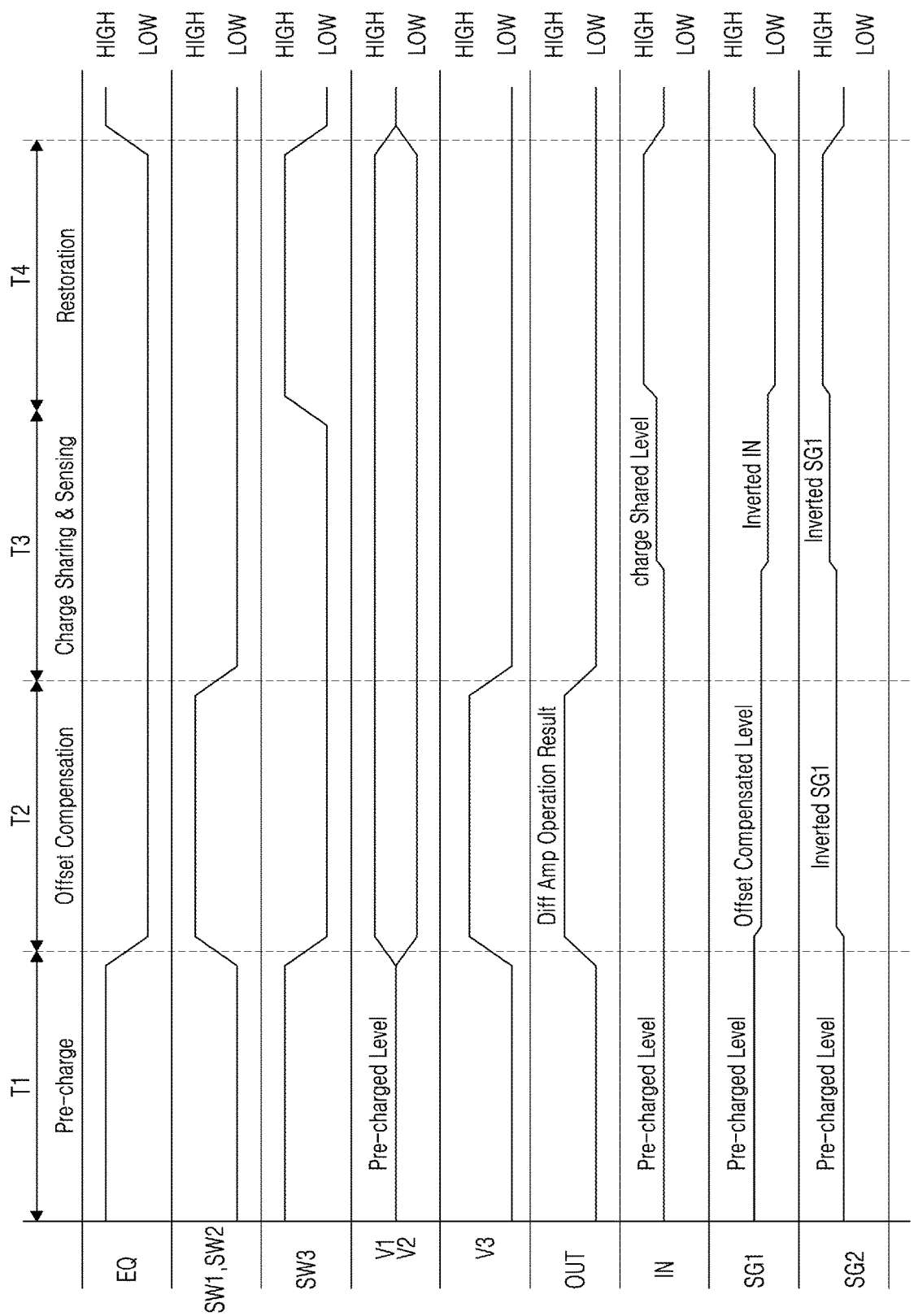
FIG. 6 is a timing diagram illustrating a sensing operation of a bit line sense amplifier according to an embodiment.

FIG. 6 is a timing diagram illustrating the sensing operation of the bit line sense amplifier 150 according to an embodiment.

Referring to FIG. 6, the bit line sense amplifier 150 according to an embodiment may perform the bit line sensing operation after completing processes of first through fourth intervals T1 through T4. According to an embodiment, the first interval T1 may represent a precharge interval, the second interval T2 may represent an offset compensation interval, the third interval T3 may represent a charge sharing interval, and the fourth interval T4 may represent a restoration interval. Before the charge sharing interval, the third interval T3 may include an interval, in which a connection relationship between the first and second nodes ND1 and ND2 of the first and second inverters INV1 and INV2 in FIGS. 2 through 4 is changed, and an interval, in which the charge sharing operation is waited for, together. In addition, the first through fourth intervals T1 through T4 may be continuously repeated according to operations of the bit line sense amplifier 150.

In the first interval T1, the precharge control signal VEQ provided to an equalizer EQ may be activated, and the bit lines BL may be precharged to a preset precharge voltage. The precharge control signal EQ may be in, for example, a logic 'high' state. In this case, the third switch SW3 may be in a closed state, and the first switch SW1 and the second switch SW2 may be in an open state. In addition, the voltage V1 output from the first transistor TR1 of the first inverter INV1 may be the same as the voltage V2 output from the second transistor TR2. For example, the voltage V1 output from the first transistor TR1 of the first inverter INV1 and the voltage V2 output from the second transistor TR2 may be in a pre-charged level state. After the first interval T1, the precharge control signal VEQ may be deactivated, for example, in a logic 'low' state.

In the second interval T2, the input signal IN may be input to the first inverter INV1 while maintaining a constant state. In this case, the first switch SW1 and the second switch SW2 may be closed, and the first signal SG1 and the second signal SG2 may be respectively output to the first and second nodes ND1 and ND2 of each of the first and second inverters INV1 and INV2. In this case, the voltage V1 output from the first transistor TR1 (both TR1 and TR2 to be modified according to drawings) of the first inverter INV1 may be different from the voltage V2 output from the second transistor TR2. For example, the voltage V1 output from the first transistor TR1 of the first inverter INV1 may be in a logic 'high' state, and the voltage V2 output from the second transistor TR2 may be in a logic 'low' state. In this case, the voltage V1 output from the first transistor TR1 may include an input to the first current source 151. In addition, a voltage V3 applied to the differential amplifier 153 may be in a logical 'high' state. As the offset compensation operation of the first signal SG1 is performed, the input signal IN may be input as a positive input to the differential amplifier 153, and the second signal SG2 may be input as a negative input. As a result, the differential amplifier 153 may output the output signal OUT according to a change in the second signal SG2, and the offset compensation operation for the first signal SG1 may be performed on the first signal SG1 by using a feedback operation of the second signal SG2.

In the third interval T3, the input signal IN may be input to the first inverter INV1 while maintaining a constant state. In the third interval T3, all of the first switch SW1, the second switch SW2, and the third switch SW3 may be open. In other words, all signals applied to the first switch SW1, the second switch SW2, and the third switch SW3 may be in a logical 'low' state. In addition, the voltage V1 output from the first transistor TR1 of the first inverter INV1 may be different from the voltage V2 output from the second transistor TR2. For example, the voltage V1 output from the first transistor TR1 of the first inverter INV1 may be in a logic 'high' state, and the voltage V2 output from the second transistor TR2 may be in a logic 'low' state. In addition, the voltage V3 applied to the differential amplifier 153 may be in a logic 'low' state, and the output signal OUT of the differential amplifier 153 may be in a logic 'low' state. When the first switch SW1, the second switch SW2, and the third switch SW3 are all open, the input signal IN may transition to a charge share level in a pre-charge state. When the input signal IN is transitioned to the charge share level, the first signal SG1 may have a level inverted by the first inverter INV1 (inverted SG1), and as a result, the second signal SG2 may have a level inverted by the second inverter INV2 (inverted SG2). In this case, a precharge voltage may be provided to a power supply line of the bit line sense amplifier 150.

Next, in the fourth interval T4, the third switch SW3 may be closed, and the first switch SW1 and the second switch SW2 may be open. Accordingly, the voltage applied to the third switch SW3 may be in a 'high' state. In addition, the voltage V1 output from the first transistor TR1 of the first inverter INV1 may be different from the voltage V2 output from the second transistor TR2. For example, the voltage V1 output from the first transistor TR1 of the first inverter INV1 may be in a logic 'high' state, and the voltage V2 output from the second transistor TR2 may be in a logic 'low' state. In addition, the voltage V3 applied to the differential amplifier 153 may be in a logic 'low' state, and the output signal OUT of the differential amplifier 153 may be in a logic 'low' state. In this case, a positive terminal of the differential amplifier 153 may include a non-inverting input terminal, and a negative terminal may include an inverting input terminal. In addition, a magnitude of a voltage applied to the differential amplifier 153 may be a value having a difference between a voltage input to the positive terminal and a voltage input to the negative terminal. When the first switch SW1 and the second switch SW2 are open and the third switch SW3 is closed, the input signal IN may transition from the charge share level to a logical 'high' state. When the input signal IN is transitioned to a logic 'high' state, the first signal SG1 may be converted to a logic 'low' state by the first inverter INV1, and as a result, the second signal SG2 may be converted to a logic 'high' state by the second inverter INV2. The input terminal NIP may be connected to the second node ND2 by an operation of the fourth interval T4, and a state of the memory cell may be restored by a complementary operation of the input signal IN and the second signal SG2.

Figure 7:
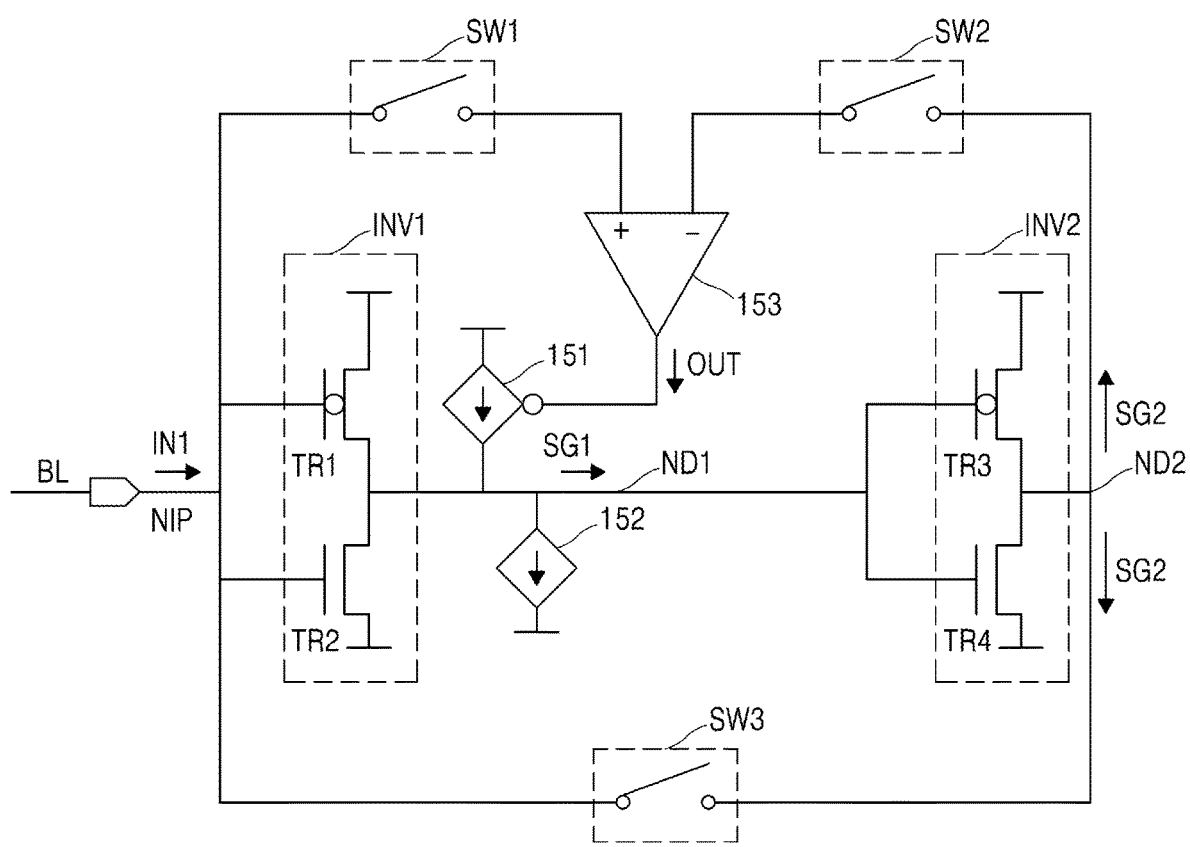
FIGS. 7 through 9 are circuit diagrams of bit line sense amplifiers according to other embodiments.
Figure 8:
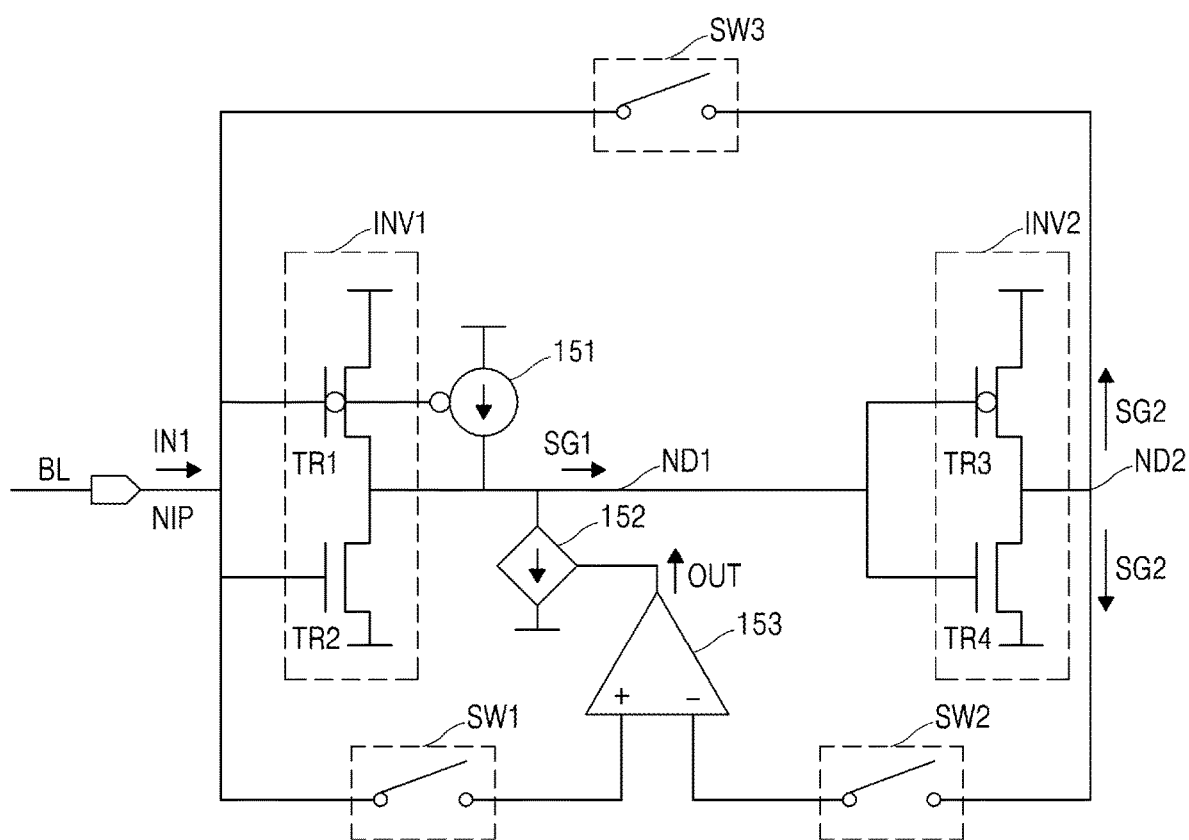
Figure 9:
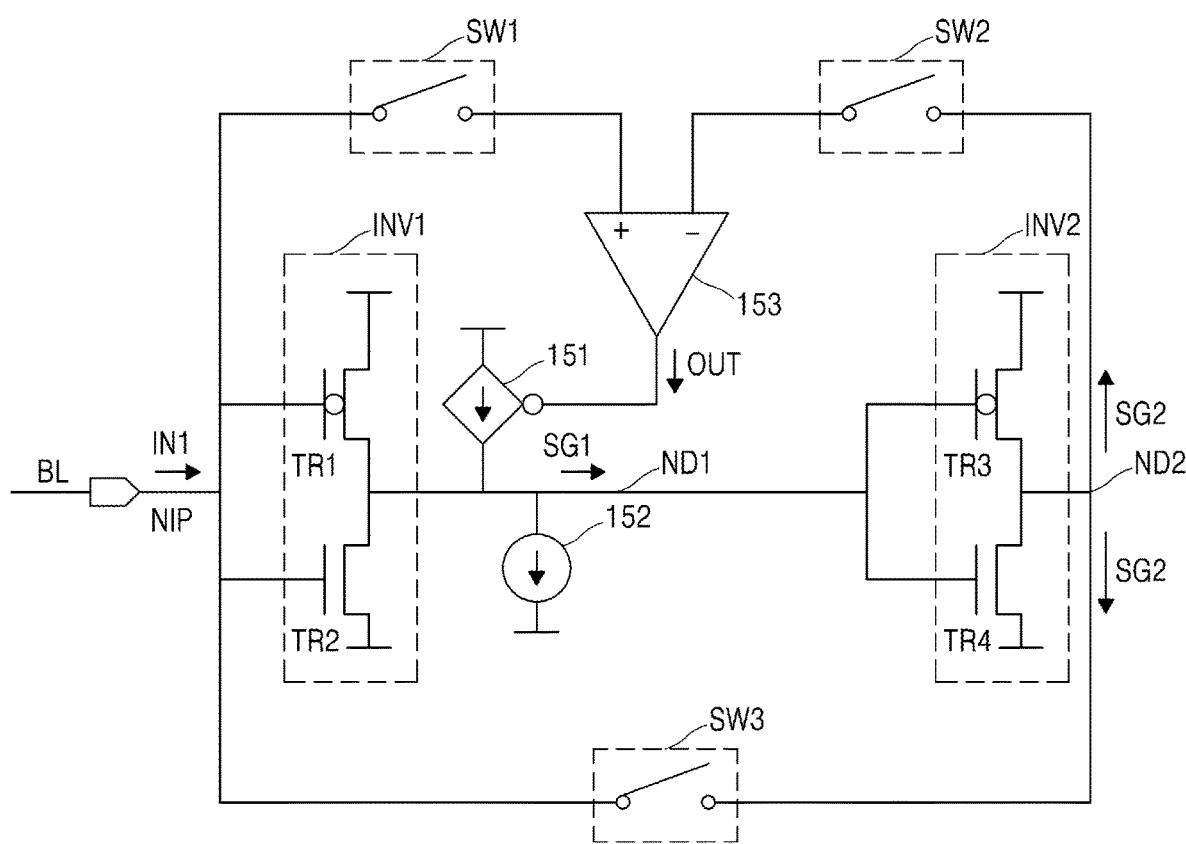

FIGS. 7 through 9 are circuit diagrams of bit line sense amplifiers 150a, 150b, and 150c according to other embodiments, respectively.

Referring to FIG. 7, the first current source 151 and the second current source 152 of the bit line sense amplifier 150a according to an embodiment may be dependent current sources. In addition, the differential amplifier 153 may be connected to the first current source 151. In addition, referring to FIG. 7, the first current source 151 of the bit line sense amplifier 150a according to an embodiment may include a dependent current source and the second current source 152 may include an independent current source. When the differential amplifier 153 is connected to the first current source 151, the output signal OUT of the differential amplifier 153 may act as a voltage control signal for the first current source 151.

For example, when the bit line sense amplifier 150a according to an embodiment performs the offset compensation operation of the first signal SG1, the third switch SW3 may be open, and the first switch SW1 and the second switch SW2 may be closed, and the second signal SG2 may include a negative input signal of the differential amplifier 153. In addition, the input signal IN may include a positive input signal of the differential amplifier 153. When the input signal IN and the second signal SG2 are input to the differential amplifier 153, the output signal OUT of the differential amplifier 153 may control the voltage of the first current source 151, and the first current source 151 may adjust the first signal SG1 by generating a pull-up current.

In addition, when the bit line sense amplifier 150a according to an embodiment performs the sensing operation, all of the first switch SW1, the second switch SW2, and the third switch SW3 may be open, and the bit line sense amplifier 150a may sense a state of a memory cell by using an operation of the third interval T3 described with reference to FIG. 5. In addition, when the bit line sense amplifier 150a according to an embodiment performs the restoration operation, the third switch SW3 may be closed, the first switch SW1 and the second switch SW2 may be open, and the bit line sense amplifier 150a may restore the state of the memory cell by using the process of the fourth interval T4 described with reference to FIG. 5.

Referring to FIG. 8, the first current source 151 of the bit line sense amplifier 150b according to an embodiment may include an independent current source and the second current source 152 may include a dependent current source. In addition, the differential amplifier 153 may be connected to the second current source 152. When the differential amplifier 153 is connected to the second current source 152, the output signal OUT of the differential amplifier 153 may act as a voltage control signal for the second current source 152.

For example, when the bit line sense amplifier 150b according to an embodiment performs the offset compensation operation of the first signal SG1, the third switch SW3 may be open, and the first switch SW1 and the second switch SW2 may be closed, and the second signal SG2 may include a negative input signal of the differential amplifier 153. In addition, the input signal IN may include a positive input signal of the differential amplifier 153. When the input signal IN and the second signal SG2 are input to the differential amplifier 153, the output signal OUT of the differential amplifier 153 may control the voltage of the second current source 152, and the second current source 152 may adjust the first signal SG1 by generating a pull-down current. In this case, because the first current source 151 is an independent current source, it may continuously generate a current of a preset value.

In addition, when the bit line sense amplifier 150b according to an embodiment performs the sensing operation, all of the first switch SW1, the second switch SW2, and the third switch SW3 may be open, and the bit line sense amplifier 150b may sense the state of the memory cell by using an operation of the third interval T3 described with reference to FIG. 5. In addition, when the bit line sense amplifier 150b according to an embodiment performs the restoration operation, the third switch SW3 may be closed, the first switch SW1 and the second switch SW2 may be open, and the bit line sense amplifier 150b may restore the state of the memory cell by using the process of the fourth interval T4 described with reference to FIG. 5.

Referring to FIG. 9, the first current source 151 of the bit line sense amplifier 150c according to an embodiment may include a dependent current source, and the second current source 152 may include an independent current source. In addition, the differential amplifier 153 may be connected to the first current source 151. When the differential amplifier 153 is connected to the first current source 151, the output signal OUT of the differential amplifier 153 may act as a voltage control signal for the first current source 151.

For example, when the bit line sense amplifier 150c according to an embodiment performs the offset compensation operation of the first signal SG1, the third switch SW3 may be open, and the first switch SW1 and the second switch SW2 may be closed, and the second signal SG2 may include a negative input signal of the differential amplifier 153. In addition, the input signal IN may include a positive input signal of the differential amplifier 153. When the input signal IN and the second signal SG2 are input to the differential amplifier 153, the output signal OUT of the differential amplifier 153 may control the voltage of the first current source 151, and the first current source 151 may adjust the first signal SG1 by generating a pull-up current. In this case, because the second current source 152 is an independent current source, it may continuously generate a current of a preset value.

In addition, when the bit line sense amplifier 150c according to an embodiment performs the sensing operation, all of the first switch SW1, the second switch SW2, and the third switch SW3 may be open, and the bit line sense amplifier 150c may sense the state of the memory cell by using an operation of the third interval T3 described with reference to FIG. 5. In addition, when the bit line sense amplifier 150c according to an embodiment performs the restoration operation, the third switch SW3 may be closed, the first switch SW1 and the second switch SW2 may be open, and the bit line sense amplifier 150c may restore the state of the memory cell by using the process of the fourth interval T4 described with reference to FIG. 5.

Figure 10:
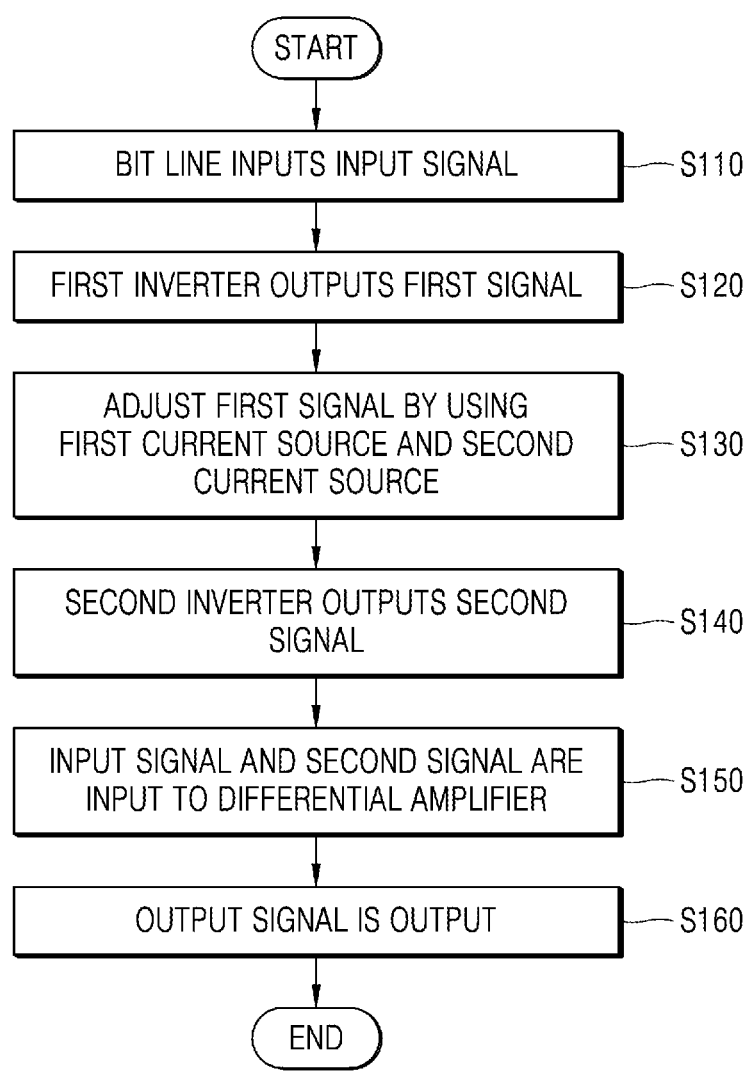
FIG. 10 is a flowchart of a bit line sensing method according to an embodiment.

FIG. 10 is a flowchart of a bit line sensing method according to an embodiment.

Referring to FIG. 10, according to an embodiment of the bit line sensing method, the input signal IN may be input to the bit line sense amplifier 150 from the bit line BL (S110). In this case, the input signal IN may be input to the first inverter INV1 via the input terminal NIP. In addition, the input terminal NIP may include an input node.

When the input signal IN is input to the first inverter INV1, the first signal SG1 may be output from the first inverter INV1 (S120). The first signal SG1 may be output to the first node ND1, and the input signal IN may include a signal converted by the first inverter INV1. The first signal SG1 may be used as an intermediate signal for performing the offset compensation operation. For example, the first signal SG1 may be used as an input of the second inverter INV2, and the second inverter INV2 may provide the first signal SG1 as feedback by generating the second signal SG2. In other words, the first signal SG1 may be used as an intermediate signal for the complete offset compensation operation, as a final subject to the offset compensation operation, and the bit line sense amplifier 150 according to an embodiment may continuously provide the first signal SG1 as feedback.

When the first signal SG1 is output, the first signal SG1 may be adjusted by the first current source 151 and the second current source 152 (S130). In this case, the first current source 151 may generate a pull-up current, and the second current source 152 may generate a pull-down current. In addition, the first current source 151 and the second current source 152 may include a dependent current source or an independent current source, respectively. A process of processing the first signal SG1 in the case, where the first current source 151 and the second current source 152 are respectively a dependent current source and an independent current source, is described in detail with reference to FIGS. 11 and 12.

As described above, the first signal SG1 may include an input of the second inverter INV2, and when the first signal SG1 is input to the second inverter INV2, the second signal SG2 may be output from the second inverter INV2 (S140). The second signal SG2 may have a value obtained by converting the first signal SG1 by the second inverter INV2, and may be in a higher state than the first signal SG1. However, the state of the second signal SG2 is not limited thereto.

When the second signal SG2 is output, the input signal IN and the second signal SG2 may be input to the differential amplifier 153 (S150). In this case, the second signal SG2 may be used as a negative input signal of the differential amplifier 153.

When the input signal IN and the second signal SG2 are input to the differential amplifier 153, the differential amplifier 153 may output the output signal OUT (S160). The output signal OUT may be used as a voltage control signal for the first current source 151 or the second current source 152. When the output signal OUT controls a voltage with respect to the first current source 151 or the second current source 152, the first current source 151 or the second current source 152 may generate a current for adjusting the first signal SG1, and as a result, the first signal SG1 may be provided as feedback.

Figure 11:
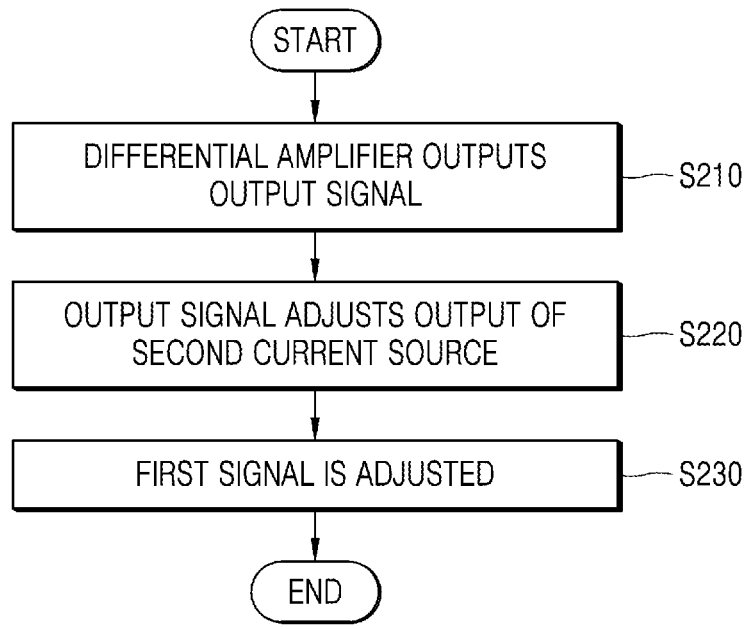
FIGS. 11 and 12 are flowcharts of offset correction operations according to embodiments.
Figure 12:
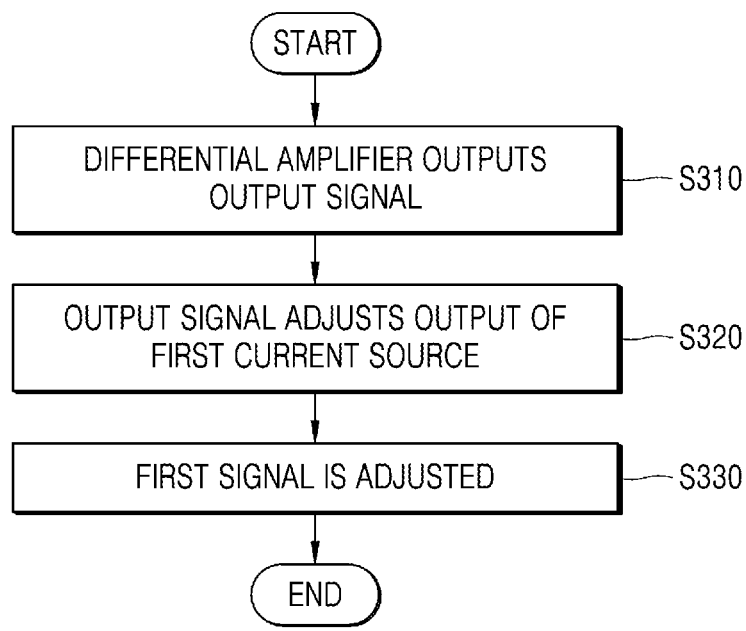

FIGS. 11 and 12 are flowcharts of the offset compensation operations according to embodiments. FIG. 11 is a flowchart of the offset compensation operation when the differential amplifier 153 is connected to the second current source 152, and FIG. 12 is a flowchart of the offset compensation operation when the differential amplifier 153 is connected to the first current source 151.

Referring to FIG. 11, the output signal OUT may be output from the differential amplifier 153 of the bit line sense amplifier 150 according to an embodiment (S210).

The output signal OUT generated by the differential amplifier 153 may adjust the output of the second current source 152 (S220). When the second current source 152 is a dependent current source and connected to an output terminal of the differential amplifier 153, the second current source 152 may perform the offset compensation operation on the first signal SG1 based on the output of the differential amplifier 153 with respect to the second signal SG2 and the input signal IN. For example, when the magnitude of the second signal SG2 is not sufficient to perform the bit line sensing operation, the second current source 152 may increase generation of a pull-down current for adjusting the value of the first signal SG1 to be less. However, when the magnitude of the second signal SG2 exceeds the magnitude for performing the bit line sensing operation, the second current source 152 may reduce generation of the pull-down current to adjust the value of the first signal SG1 to be greater.

The first signal SG1 may be adjusted by using the feedback process on the first signal SG1 described above (S230).

Referring to FIG. 12, the output signal OUT may be output from the differential amplifier 153 of the bit line sense amplifier 150 according to an embodiment (S310).

The output signal OUT generated by the differential amplifier 153 may adjust the output of the first current source 151 (S320). When the first current source 151 is a dependent current source and connected to an output terminal of the differential amplifier 153, the first current source 151 may perform the offset compensation operation on the first signal SG1 based on the output of the differential amplifier 153 with respect to the second signal SG2 and the input signal IN. For example, when the magnitude of the second signal SG2 is not sufficient to perform the bit line sensing operation, the first current source 151 may adjust (e.g., decrease) a pull-up current for adjusting the value of the first signal SG1 to be less. However, when the magnitude of the second signal SG2 exceeds the magnitude for performing the bit line sensing operation, the first current source 151 may increase generation of the pull-up current to adjust the value of the first signal SG1 to be greater.

The first signal SG1 may be adjusted by using the feedback process on the first signal SG1 described above (S330).

As a result of adjusting the first signal SG1 according to the offset compensation operations of FIGS. 11 and 12 described above, the bit line sense amplifier 150 may perform the offset compensation operation on the first signal SG1. In this case, because the capacitance load of the first signal SG1 has a value less than the capacitance load of the input signal IN, a relatively fast offset compensation may be performed, and may be free from distribution.

Figure 13:
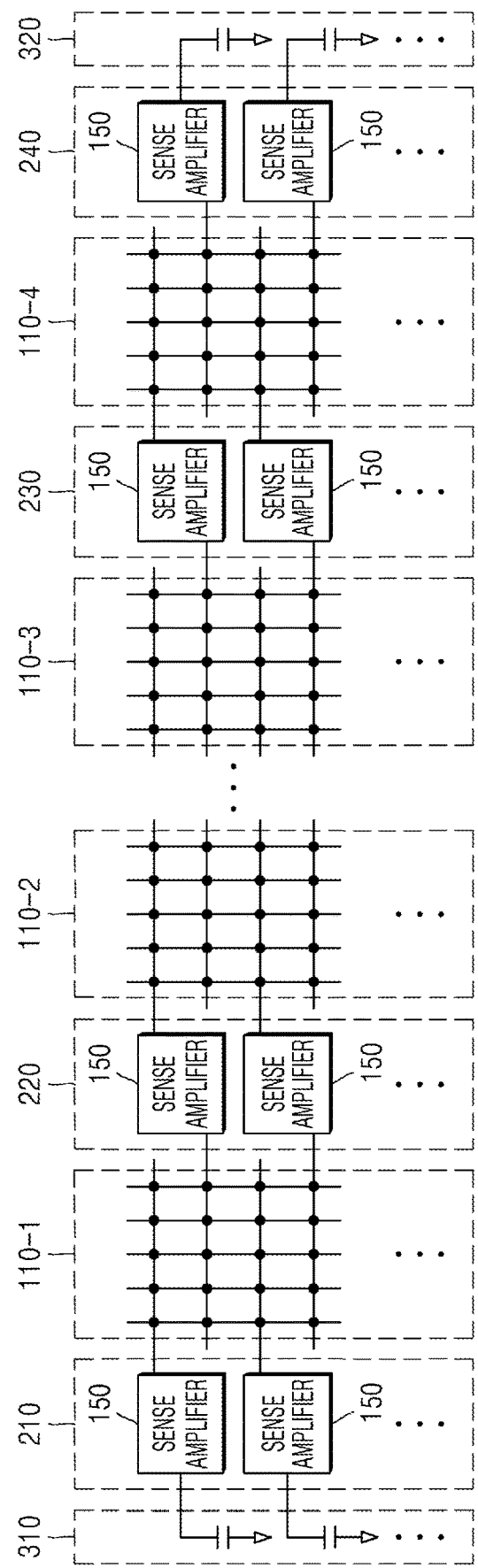
FIGS. 13 and 14 illustrate examples in which memory devices according to an embodiment are applied.
Figure 14:
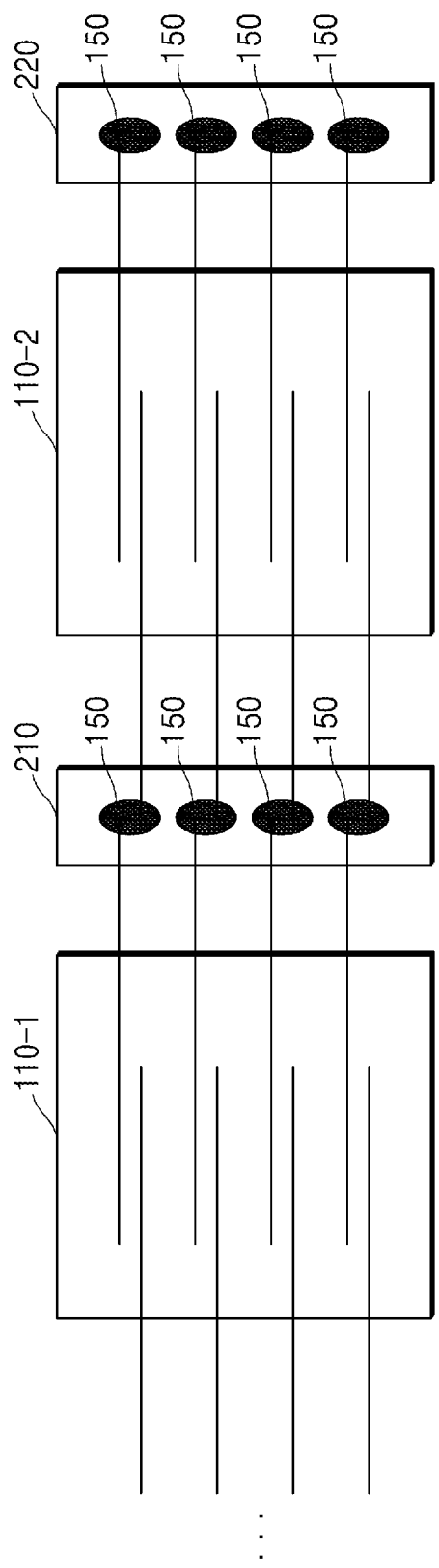

FIGS. 13 and 14 illustrate examples, in which blocks of the memory device 100 according to an embodiment are applied.

Referring to FIGS. 13 and 14, the blocks of the memory device 100 may include a plurality of memory cell array blocks 110-1, 110-2, 110-3, and 110-4 and a plurality of bit line sense amplifier blocks 210, 220, 230, and 240, and may further include capacitor blocks 310 and 320. Each of the plurality of bit line sense amplifier blocks 210, 220, 230, and 240 may include a plurality of bit line sense amplifiers 150, and in addition, each of the plurality of memory cell array blocks 110-1, 110-2, 110-3, and 110-4 may include an array of a plurality of memory cells. The capacitor blocks 310 and 320 may include a plurality of capacitors. The capacitor may be arranged to prevent capacitance imbalance between the bit line BL and a complementary bit line BLB, and may be referred to as a balance capacitor.

The second and third sense amplifier blocks 220 and 230 arranged between the plurality of memory cell array blocks 110-1, 110-2, 110-3, and 110-4. The memory cell array blocks 110-2 and 110-3 may be connected to one bit line BL of the memory cell array blocks arranged in each of both directions. The bit line sense amplifiers 150 included in the first sense amplifier block 210 and the fourth sense amplifier block 240 arranged on the edges thereof may be connected to one bit line BL of the memory cell array blocks 110-2 and 110-4 arranged in one direction, respectively, and may be connected to capacitors in another direction to prevent capacitance imbalance. Alternatively, the bit line sense amplifiers 150 may be connected to the bit line BL including the dummy cells for preventing capacitance imbalance. In this manner, when one bit line BL is connected in each of both directions of the bit line sense amplifier 150, and one of the bit lines becomes a complementary bit line, that is, a reference bit line, the structure of the bit line sense amplifier 150 may be referred to as an open bit line sense amplifier structure.

In this case, it may be determined which one of the first switch SW1, the second switch SW2, and the third switch SW3 of the bit line sense amplifier is to be closed according to whether the memory cell array block to be sensed is an odd or even memory cell array block. However, the method described above is only an example and not limited thereto, and it may be understood by those of skill in the art that various modifications are possible.

FIG. 14 illustrates that, in the structure described above of the memory device, the bit line sense amplifiers 150 according to the inventive concept are connected in the form of a single-ended sense amplifier. Referring to FIG. 14, each of the first and second sense amplifier blocks 210 and 220 may include a plurality of bit line sense amplifiers 150. In this case, the first sense amplifier block 210 may be connected to a plurality of memory cell array blocks 110-1 and 110-2, and the second sense amplifier block 220 may be connected to a single memory cell array block 110-2. In other words, the bit line sense amplifier 150 according to an embodiment may be configured in the form of a single ended sense amplifier, and may also perform the sensing operation on a dummy line of an edge memory cell array block. A structure, in which the bit line sense amplifier 150 according to an embodiment is connected to the memory cell block, is described in detail with reference to FIGS. 15 and 16. The dummy line herein may mean a line or a pattern of the memory cell array block that does not have an electrical function of other lines or patterns of the memory cell array block but has a similar structural form to those other lines and patterns.

Figure 15:
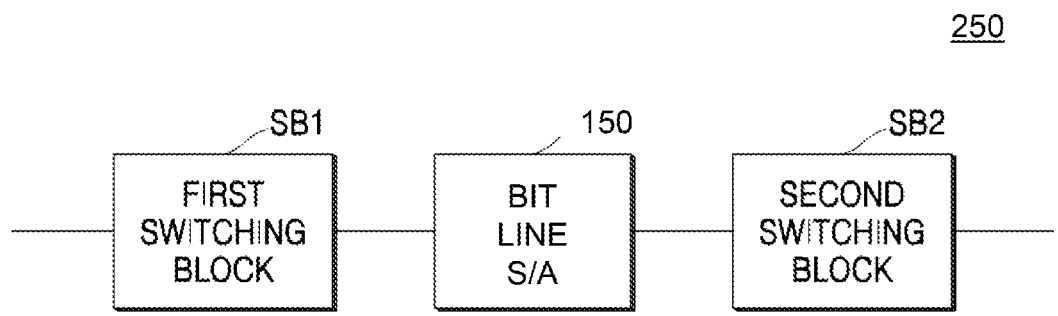
FIG. 15 is a block diagram illustrating an example in which a bit line sense amplifier is applied, according to an embodiment.
Figure 16:
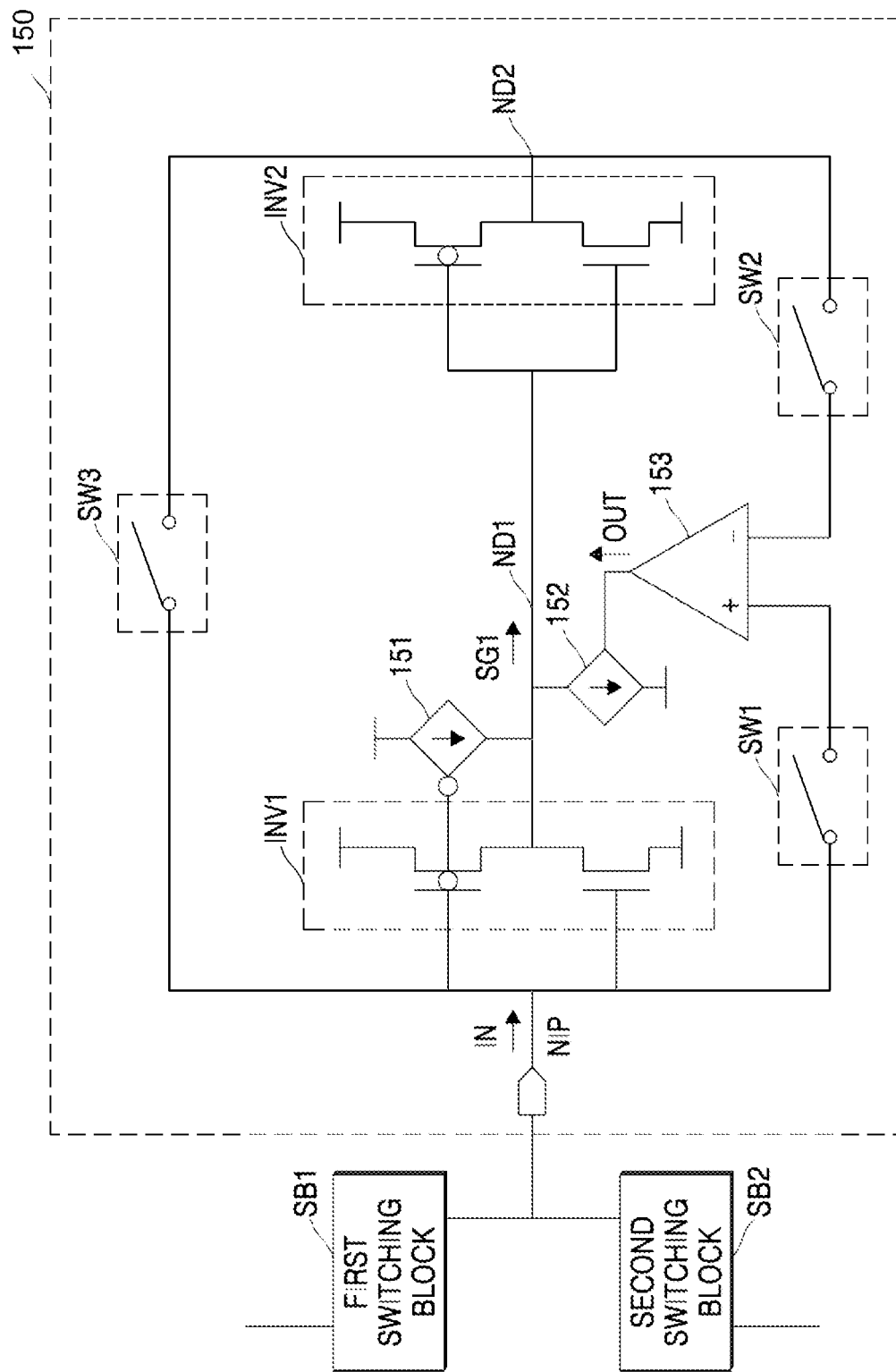
FIG. 16 is a circuit diagram illustrating an example in which a bit line sense amplifier is applied, according to an embodiment.

FIG. 15 is a block diagram of an example of a sense amplifier 250, in which the bit line sense amplifier 150 according to an embodiment is applied, and FIG. 16 is a circuit diagram of an example of the sense amplifier 250, in which the bit line sense amplifier 150 according to an embodiment is applied.

Referring to FIG. 15, the sense amplifier 250 according to an embodiment may include the bit line sense amplifier 150 and a switching unit, and in this case, the switching unit may include a first switching block SB1 and a second switching block SB2.

The sense amplifier 250 according to an embodiment may include the bit line sense amplifier 150 described with reference to FIGS. 1 through 14 (e.g., 150a, 150b, and 150c).

Referring to FIGS. 15 and 16, the first switching block SB1 and the second switching block SB2 may be connected to an input terminal of the bit line sense amplifier 150, and select the input signal IN input to the bit line sense amplifier 150.

Referring to FIGS. 14 through 16 again, the first switching block SB1 and the second switching block SB2 may be connected to the input terminal of the bit line sense amplifier 150, and determine whether to receive a bit line signal from one of a first memory cell array block 110-1 and a second memory cell array block 110-2. For convenience, when the first switching block SB1 functions a switching unit connected to the first memory cell array block 110-1 and the second switching block SB2 functions a switching unit connected to the second memory cell array block 110-2, the first switching block SB1 may be closed so that the bit line sense amplifier 150 may receive a signal from the first memory cell array block 110-1. Similarly, the second switching block SB2 may be closed so that the bit line sense amplifier 150 may receive a signal from the second memory cell array block 110-2. In other words, because the sense amplifier 250 according to an embodiment may be configured in the form of a single ended sense amplifier, an input signal input to the bit line sense amplifier 150 may be selected by a switching unit (e.g., SB1 or SB2).

On the other hand, the sense amplifier 250 according to an embodiment may be connected to one memory cell array block. For example, the bit line sense amplifier 150 may be connected to the dummy lines of memory cells in an edge area. When the bit line sense amplifier 150 is connected to the memory cell array block of the edge area, switches of the second switching block SB2 may be closed.

Because the sense amplifier 250 according to an embodiment may be configured in the form of the single ended sense amplifier, the bit line sense amplifier 150 may be connected to the dummy lines of memory cells in the edge area, and may also be connected to a plurality of memory cells via the first switching block SB1 and the second switching block SB2.

Figure 17:
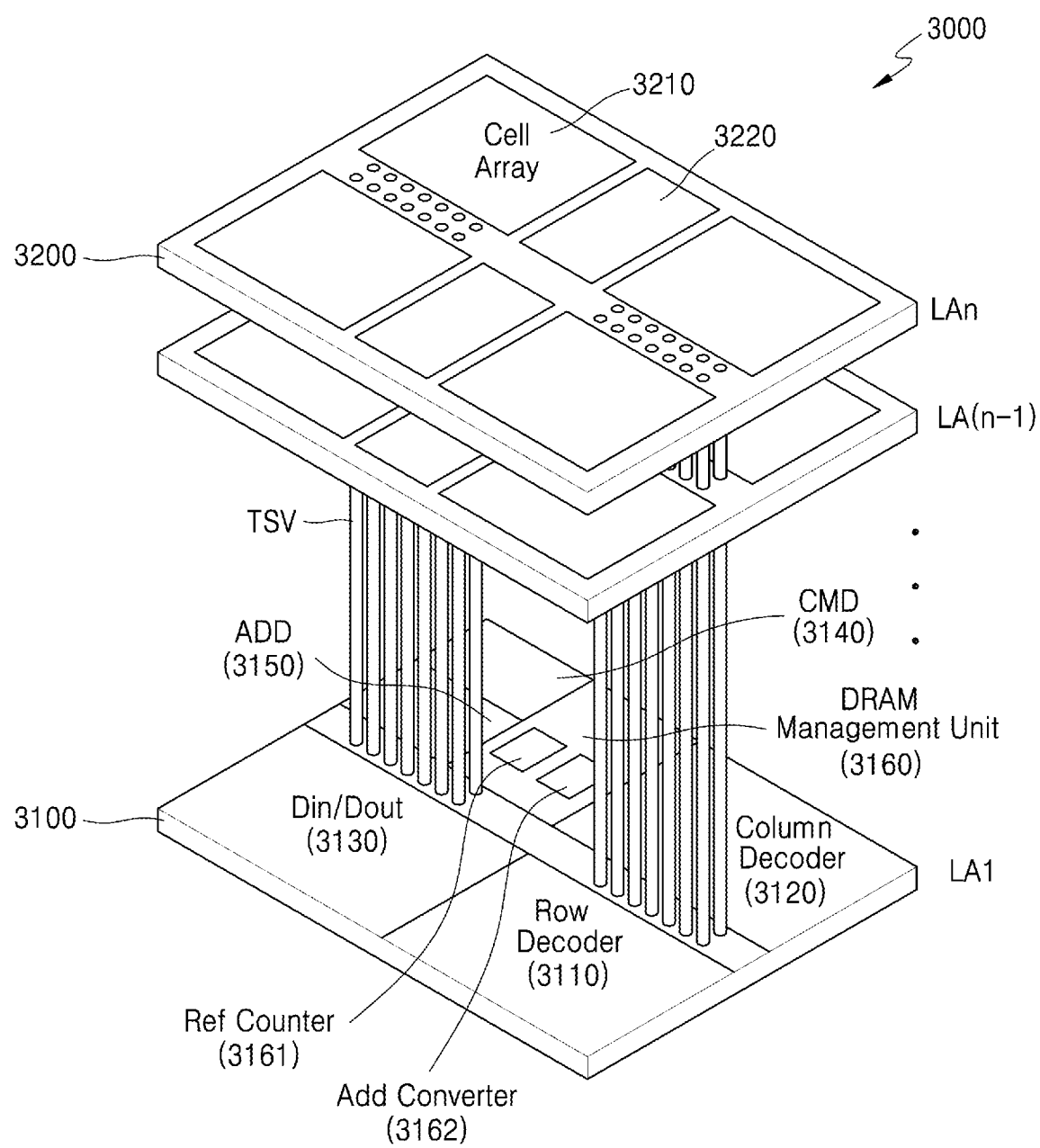
FIG. 17 is a structure diagram of an implementation example of a semiconductor memory device, according to an embodiment.

FIG. 17 is a structure diagram of an implementation example of a semiconductor memory device 3000, according to an embodiment.

As shown in FIG. 17, the semiconductor memory device 3000 may include a plurality of semiconductor layers LA1 through LAn. Each of the plurality of semiconductor layers LA1 through LAn may include a memory chip including a DRAM cell, or some of the semiconductor layers LA1 through LAn may include master chips, which perform interfacing with an external controller, and the remaining ones may include slave chips, which store data. In the example of FIG. 17, it is assumed that the semiconductor layer LA1, that is lowest is a master chip, and the remaining semiconductor layers, that is, LA2 through LAn, are slave chips.

The plurality of semiconductor layers LA1 through LAn may transceive signals to and from each other via a through silicon via TSV, and the master chip, or the semiconductor layer LA1, may communicate with an external memory controller (not illustrated) via a conductive means (not illustrated) formed on an outer surface of the master chip. The configuration and operation of the semiconductor memory device 3000 are described below, based on a first semiconductor layer 3100 (e.g., LA1) as a master chip and an $n^{th}$ semiconductor layer 3200 (e.g., LAn) as a slave chip.

The first semiconductor layer 3100 may include various circuits for driving a cell array 3210 provided in the slave chips (e.g., the $n^{th}$ semiconductor layer 3200). For example, the first semiconductor layer 3100 may include a row decoder (X-Dec) 3110 for driving the word line of the cell array 3210, a column decoder (Y-Dec) 3120 for driving the bit line BL, a data input/output unit (Din/Dout) 3130 for controlling an input/output of data, a command buffer (CMD) 3140 for receiving the command CMD from the outside, an address buffer (ADD) 3150 for buffering an address after receiving addresses from the outside, etc.

In addition, the first semiconductor layer 3100 may further include a DRAM management unit 3160 for managing a memory operation of the slave chip. On the other hand, the $n^{th}$ semiconductor layer 3200 may include the cell array 3210 and a periphery circuit area 3220, in which other periphery circuits for driving the cell array 3210 are arranged. For example, a row/column selection unit (not illustrated) for selecting rows and columns of the cell array 3210, a bit line sense amplifier, and the like may be arranged in the periphery circuit area 3220. In this case, the bit line sense amplifier may include the bit line sense amplifiers 150, 150a, 150b, and 150c according to the embodiments described above. Accordingly, the sensing sensitivity of a bit line may be increased by compensating for an offset of inverters of a bit line sense amplifier.

Figure 18:
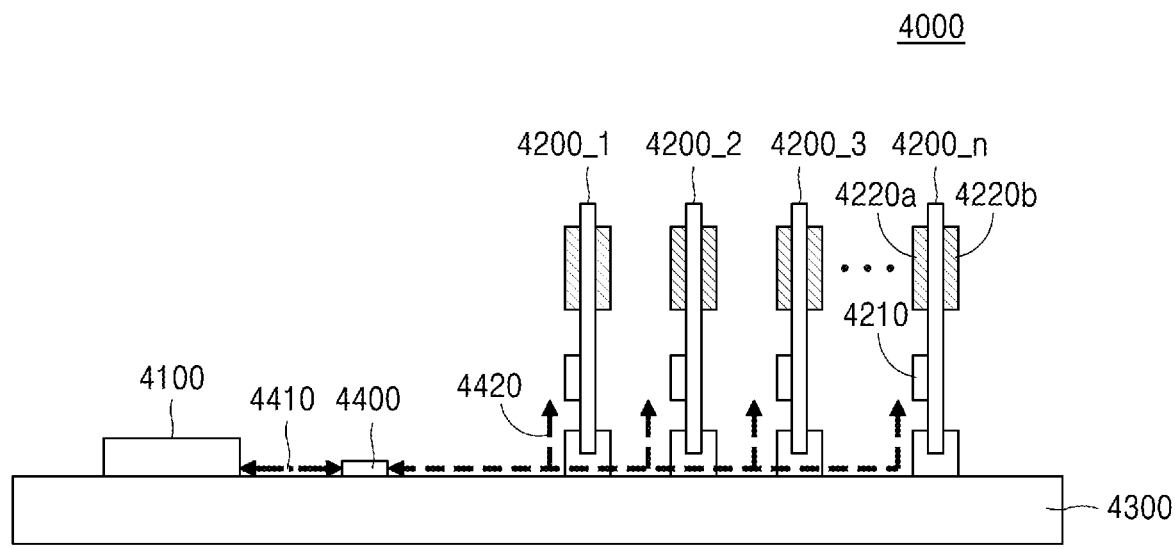
FIG. 18 is a structure diagram of an example of a server system including a semiconductor memory device, according to an embodiment.

FIG. 18 is a structure diagram of an example of a server system 4000 including a semiconductor memory device, according to an embodiment.

In FIG. 18, the server system 4000 may include a memory controller 4100 and a plurality of memory modules (MM) 4200_1 through 4200_n. Each of the plurality of MMs 4200_1 through 4200_n may include memory blocks 4220a and 4220b including a plurality of memory chips. For example, the memory chips constituting the memory blocks 4220a and 4220b may include DRAM chips.

The plurality of MMs 4200_1 through 4200_n may include memory modules, to which the bit line sense amplifiers 150, 150a, 150b, and 150c according to the embodiments described above or memory device 100 and semiconductor memory device 3000 according to the embodiments described above are applied. Accordingly, the sensing sensitivity of a bit line may be increased by compensating for an offset of inverters of a bit line sense amplifier.

In FIG. 18, the server system 4000 is illustrated having a single channel structure, in which the memory controller 4100 and the plurality of MMs 4200_1 through 4200_n are mounted on the same circuit substrate 4300. However, this is only an example, and the embodiment is not limited thereto. The server system 4000 may be designed in various structures, such as a multi-channel structure, in which sub-substrates each including a plurality of MMs are coupled to sockets of a main substrate including the memory controller 4100 mounted thereon.

On the other hand, signal transmission of the plurality of MMs 4200_1 through 4200_n may be performed by using an optical input/output (I/O) connection. The server system 4000 may further include an electro-optical conversion unit 4400, and each of the plurality of MMs 4200_1 through 4200_n may further include an optical-electro conversion unit 4210. In addition, according to another embodiment, the electro-optical conversion unit 4400 may be embedded in the memory controller 4100.

The memory controller 4100 may be connected to the electro-optical conversion unit 4400 via an electrical channel 4410. Accordingly, the memory controller 4100 may exchange signals with the electro-optical conversion unit 4400 via the electrical channel 4410.

The electro-optical conversion unit 4400 may convert an electrical signal received from the memory controller 4100 into an optical signal and transmit the optical signal to an optical channel 4420, and may convert the optical signal received via the optical channel 4420 into an electrical signal and transmit the electrical signal to the electrical channel 4410.

The plurality of MMs 4200_1 through 4200_n may be connected to the electro-optical conversion unit 4400 via the optical channel 4420. The optical signal transmitted via the optical channel 4420 may be applied to the optical-electro conversion unit 4210 included in each of the plurality of MMs 4200_1 through 4200_n. The optical-electro conversion unit 4210 may convert the optical signal into the electrical signal and transmit the electrical signal to each of the memory blocks 4220a and 4220b. In addition, the electrical signals generated in each of the memory blocks 4220a and 4220b may be converted into the optical signals by the optical-electro conversion unit 4210 and may be output.

As described above, in the server system 4000, signal transmission between the memory controller 4100 and a plurality of memory blocks 4220a and 4220b may be performed via the optical channel 4420 in an optical input/output manner.

Figure 19:
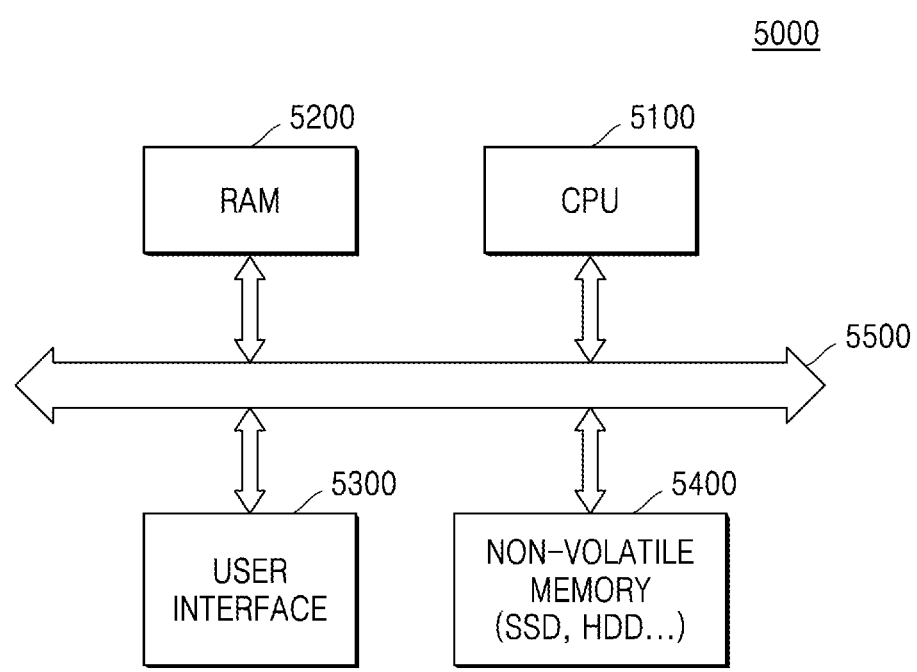
FIG. 19 is a block diagram of a computing system including memory devices, according to an embodiment.

FIG. 19 is a block diagram of a computing system 5000 including memory devices, according to an embodiment.

Semiconductor memory devices of the inventive concept may be mounted as RAM 5200 in an information processing system (e.g., the computing system 5000), such as a mobile device and a desktop computer. The RAM 5200 may include a semiconductor memory device, or may have the form of a memory module. In addition, the RAM 5200 in FIG. 19 may have a concept that memories, memory devices, and a memory controller are included therein.

The computing system 5000 according to an embodiment may include a central processing unit (CPU) 5100, the RAM 5200, a user interface 5300, and a non-volatile memory 5400, and each of these components may be electrically connected to a bus 5500. The non-volatile memory 5400 may be used in a large capacity storage device, such as a solid state device (SSD) and a hard disk drive (HDD).

In the computing system 5000, the RAM 5200 may include a DRAM chip (not illustrated) including a DRAM cell for storing data, and in each DRAM chip, one of the bit line sense amplifiers 150, 150a, 150b, and 150c according to an embodiment may be provided. Accordingly, the sensing efficiency of data stored in the DRAM chip may be increased.

The above descriptions are merely example descriptions of the technical idea of the inventive concept, and those of skills in the art, to which the disclosed embodiments belong, should be able to make various changes and modifications of the embodiments, without departing from the essential characteristics of the inventive concept. The embodiments are not intended to limit the scope of the inventive concept but intended to describe the technical aspects of the inventive concept, and the scope of the technical aspects of the inventive concept is not limited by the embodiments. The scope of protection of the inventive concept should be construed according to the following claims, and all technical ideas, which are within the scope of the inventive concept, should be interpreted as being included in the scope of the inventive concept.

While the inventive concept has been particularly shown and described with reference to embodiments thereof, it will be understood that various changes in form and details may be made therein without departing from the scope of the following claims.

What is claimed is:

1. A bit line sense amplifier comprising:
a first inverter configured to receive an input signal from a bit line via an input terminal and configured to output a first signal to a first node;
a second inverter configured to receive the first signal and configured to output a second signal to a second node;
a differential amplifier configured to receive the input signal as a positive input, and receive the second signal as a negative input;
a first switch configured to electrically connect the input terminal to the positive input of the differential amplifier; and
a second switch configured to electrically connect the second node to the negative input of the differential amplifier,
wherein the first inverter is electrically connected to the second inverter through a first current source that is configured to provide a pull-up current to the first signal and a second current source that is configured to provide a pull-down current to the first signal.

2. The bit line sense amplifier of claim 1, wherein the first current source and the second current source each comprise a dependent current source, and
the first current source is configured to adjust the first signal based on the input signal, and the second current source is configured to adjust the first signal based on an output signal of the differential amplifier.

3. The bit line sense amplifier of claim 1, wherein the first current source and the second current source each comprise a dependent current source, and
the first current source is configured to adjust the first signal based on an output signal of the differential amplifier, and the second current source is configured to adjust the first signal based on the input signal.

4. The bit line sense amplifier of claim 1, wherein the first current source comprises an independent current source, and the second current source comprises a dependent current source, and
the second current source is configured to adjust the first signal based on an output signal of the differential amplifier.

5. The bit line sense amplifier of claim 1, wherein the first current source comprises a dependent current source, and the second current source comprises an independent current source, and
the first current source is configured to adjust the first signal based on an output signal of the differential amplifier.

6. The bit line sense amplifier of claim 1, wherein, when the first switch and the second switch are closed, an output signal of the second current source is configured to be adjusted based on an output signal of the differential amplifier, and the second signal is configured to be adjusted based on the output signal of the second current source.

7. The bit line sense amplifier of claim 1, further comprising a third switch electrically connecting the second node and the input terminal.

8. The bit line sense amplifier of claim 7, wherein, the bit line sense amplifier is configured to perform a bit line sensing operation based on the input signal when the first switch, the second switch, and the third switch are open.

9. The bit line sense amplifier of claim 7, wherein the bit line sense amplifier is configured to perform a restoration operation of a memory cell when the first switch and the second switch are open, and the third switch is closed.

10. A bit line sensing method performed by a bit line sense amplifier, the bit line sensing method comprising:
- inputting an input signal via an input terminal of the bit line sense amplifier;
- outputting a first signal to a first node using a first inverter when the input signal is input to the first inverter;
- outputting a second signal to a second node using a second inverter after the first signal is input to the second inverter; and
- inputting the input signal as a positive input and inputting the second signal as a negative input to a differential amplifier;
- wherein the first signal is adjusted by a first current source that is configured to provide a pull-up current to the first signal and a second current source that is configured to provide a pull-down current to the first signal.

11. The bit line sensing method of claim 10, wherein the first current source and the second current source each comprise a dependent current source, and
- the first current source is configured to adjust the first signal based on the input signal, and the second current source is configured to adjust the first signal based on an output signal of the differential amplifier.

12. The bit line sensing method of claim 10, wherein the first current source and the second current source each comprise a dependent current source, and
- the first current source is configured to adjust the first signal based on an output signal of the differential amplifier, and the second current source is configured to adjust the first signal based on the input signal.

13. The bit line sensing method of claim 10, wherein the first current source comprises an independent current source, and the second current source comprises a dependent current source, and
- the second current source is configured to adjust the first signal based on an output signal of the differential amplifier.

14. The bit line sensing method of claim 10, wherein the first current source comprises a dependent current source, and the second current source comprises an independent current source, and
- the first current source is configured to adjust the first signal based on an output signal of the differential amplifier.

15. The bit line sensing method of claim 10, wherein, the bit line sense amplifier further comprises a first switch electrically connecting the input terminal and the differential amplifier, and a second switch electrically connecting the second node and the differential amplifier, and
- wherein, when the first switch and the second switch are closed, an output of the second current source is adjusted based on an output of the differential amplifier, and the second signal is adjusted based on the output of the second current source.

16. The bit line sensing method of claim 10, wherein the bit line sense amplifier further comprises a first switch electrically connecting the input terminal and the differential amplifier, a second switch electrically connecting the second node and the differential amplifier, and a third switch electrically connecting the input terminal and the second node, and
- wherein, when the first switch, the second switch, and the third switch are open, a bit line sensing operation is performed based on the input signal.

17. The bit line sensing method of claim 10, wherein, the bit line sense amplifier further comprises a first switch electrically connecting the input terminal and the differential amplifier, a second switch electrically connecting the second node and the differential amplifier, and a third switch electrically connecting the input terminal and the second node, and
- wherein, when the first switch and the second switch are open, and the third switch is closed, a restoration operation of a memory cell is performed.

18. A bit line sense amplifier configured to perform a bit line sensing operation, the bit line sense amplifier comprising:
- a first inverter configured to receive an input signal via an input terminal of the first inverter and configured to output a first signal;
- a second inverter configured to receive the first signal and configured to output a second signal to a second node;
- a differential amplifier configured to receive the input signal as a positive input and configured to receive the second signal as a negative input;
- a first switch configured to electrically connect the input terminal of the first inverter and the positive input of the differential amplifier;
- a second switch configured to electrically connect the second node and the negative input of the differential amplifier;
- a first current source configured to adjust the first signal by providing a pull-up current;
- a second current source configured to adjust the first signal by providing a pull-down current; and
- a switching unit configured to electrically connect the input terminal of the first inverter and one of a plurality of bit lines.

19. The bit line sense amplifier of claim 18, wherein the switching unit comprises a first switching block electrically connected to a first memory block not including dummy lines and a second switching block electrically connected to a second memory block including dummy lines.

20. The bit line sense amplifier of claim 19, wherein the switching unit is configured to close the second switching block, when the input terminal is electrically connected to the second memory block.

* * * * *